(12) United States Patent
Seo

(10) Patent No.: US 7,006,142 B2
(45) Date of Patent: Feb. 28, 2006

(54) THREE-DIMENSIONAL IMAGE CAPTURING DEVICE

(75) Inventor: Shuzo Seo, Tokyo (JP)

(73) Assignee: PENTAX Corporation, Tokyo (JP)

( * ) Notice: Subject to any disclaimer, the term of this patent is extended or adjusted under 35 U.S.C. 154(b) by 698 days.

(21) Appl. No.: 10/121,717

(22) Filed: Apr. 15, 2002

(65) Prior Publication Data

US 2002/0149694 A1    Oct. 17, 2002

(30) Foreign Application Priority Data

Apr. 16, 2001   (JP)   ............................ P2001-116674

(51) Int. Cl.
*H04N 5/222*   (2006.01)
(52) U.S. Cl. ...................... 348/370; 348/296; 348/348; 348/207.99; 396/109
(58) Field of Classification Search ................ 348/370, 348/348, 135, 207.99, 296, 31, 42; 356/5.01, 356/3.11, 3, 5.03, 5.04; 250/208.1, 559.38; 396/109
See application file for complete search history.

(56) References Cited

U.S. PATENT DOCUMENTS

| | | | | |
|---|---|---|---|---|
| 4,708,473 A | * | 11/1987 | Metzdorff et al. | 356/5.04 |
| 5,034,810 A | * | 7/1991 | Keeler | 348/31 |
| 6,002,423 A | * | 12/1999 | Rappaport et al. | 348/42 |
| 6,721,007 B1 | * | 4/2004 | Tani et al. | 348/296 |
| 6,734,450 B1 | * | 5/2004 | Kakiuchi et al. | 250/559.38 |
| 6,822,681 B1 | * | 11/2004 | Aoki | 348/296 |
| 6,822,687 B1 | * | 11/2004 | Kakiuchi et al. | 348/348 |
| 2002/0148947 A1 | * | 10/2002 | Kakiuchi et al. | 250/208.1 |
| 2003/0147002 A1 | * | 8/2003 | Ray et al. | 348/370 |
| 2005/0041143 A1 | * | 2/2005 | Kakiuchi et al. | 348/370 |

FOREIGN PATENT DOCUMENTS

| | | | |
|---|---|---|---|
| JP | 2001-116516 | * | 4/2001 |
| JP | 2001-145126 | * | 5/2001 |
| WO | 97/01111 | | 1/1997 |

OTHER PUBLICATIONS

"Design and Development of Multi-detecting Two-dimensional Ranging Sensor", by Christie et al., Measurement Science and Technology, 1995, vol. 6, pp. 1301-1308.

* cited by examiner

*Primary Examiner*—David L. Ometz
*Assistant Examiner*—Brian Jelinek
(74) *Attorney, Agent, or Firm*—Greenblum & Bernstein, P.L.C.

(57) ABSTRACT

A three-dimensional image-capturing device comprises R, G, and B light sources, a CCD, a light-source control processor, a CCD drive circuit, and a distance-information sensing processor. Each of the RGB light sources radiates pulse modulated R, G, and B distance-measurement light beams to a measurement subject. The R, G, and B color filtered pixels of the CCD senses RGB light beams. The RGB light sources are controlled to emit the B, G, and R distance-measurement light beams successively and continuously. The CCD drive circuit controls the CCD to accumulate electric charges of the reflected light beams in a predetermined accumulation period, so that the at least one of RGB distance-measurement light beams is sensed by the CCD. The distance-information sensing processor calculates distance information of the measurement subject by using electric charges accumulated in RGB pixels which are adjacently arranged.

16 Claims, 14 Drawing Sheets

FIG. 7

| G | R | G | R |
|---|---|---|---|
| B | G | B | G |
| G | R | G | R |
| B | G | B | G |
| G | R | G | R |

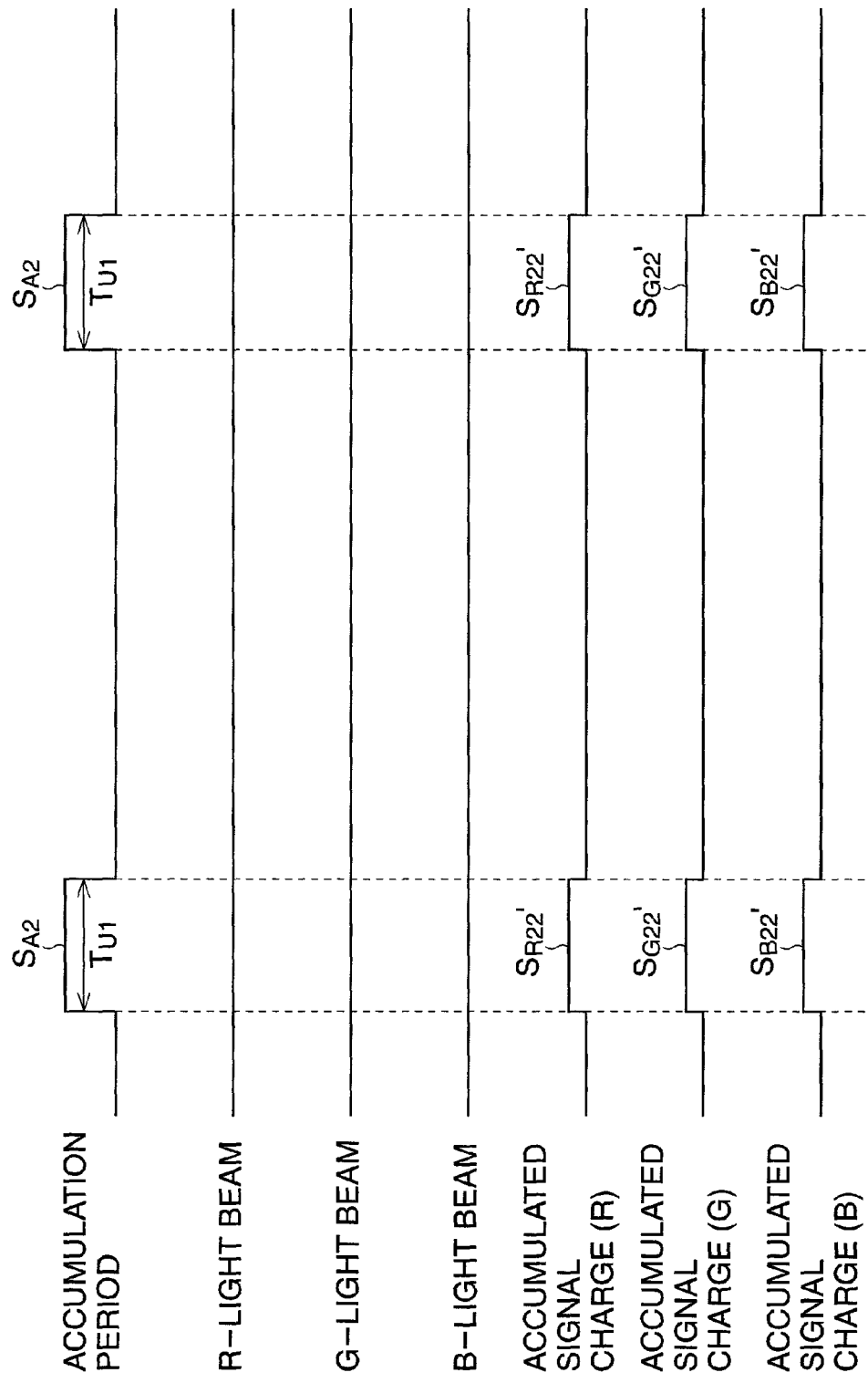

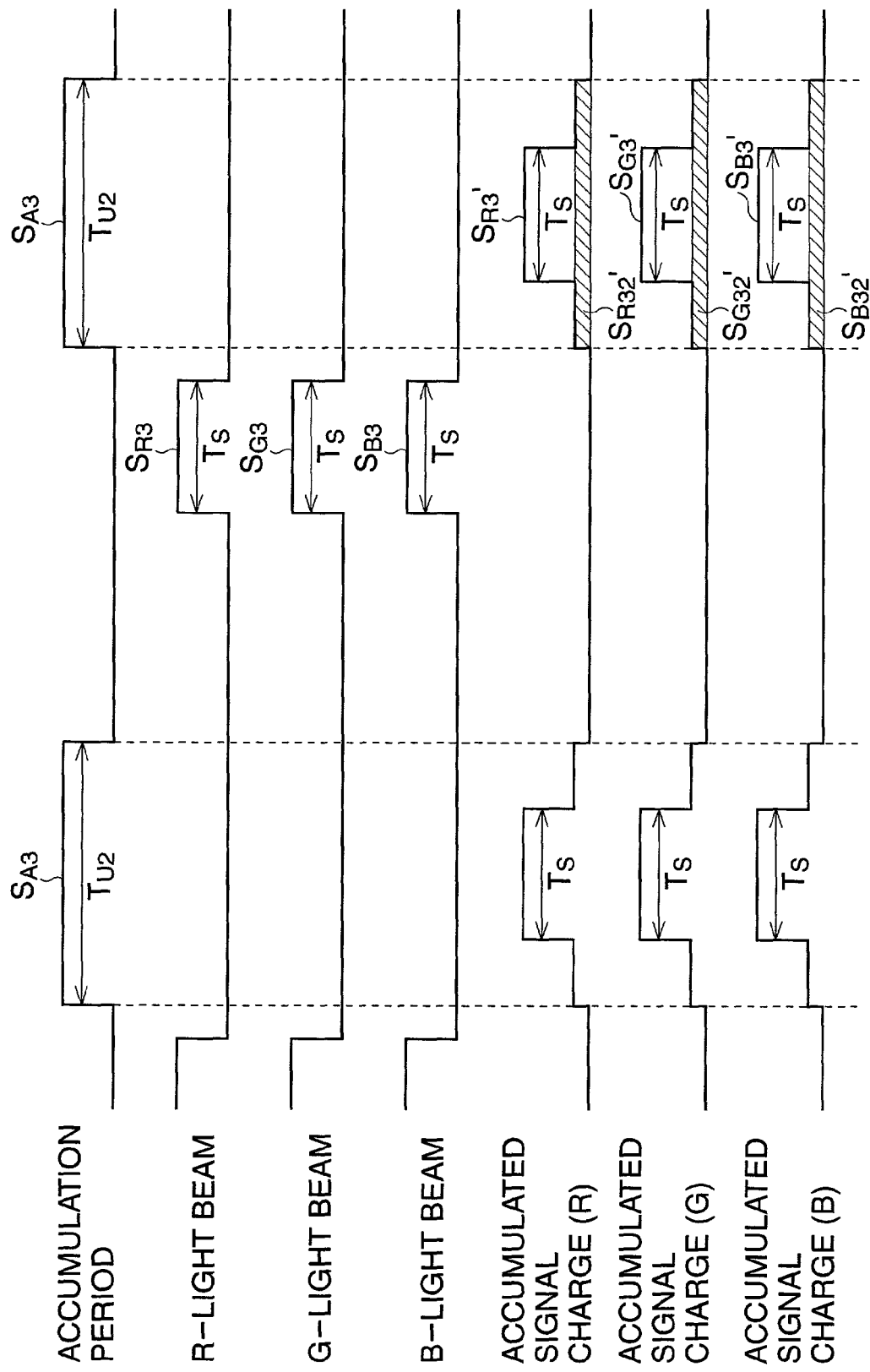

THREE-DIMENSIONAL IMAGE CAPTURING DEVICE

BACKGROUND OF THE INVENTION

1. Field of the Invention

The present invention relates to a three-dimensional image-capturing device that detects the three-dimensional shape of a measurement subject by means of a time-of-flight measurement.

2. Description of the Related Art

An example of an active-system three-dimensional image-capturing device, which detects the three-dimensional shape of a subject, is disclosed in "Measurement Science and Technology" (S. Christies et al., vol. 6, p.1301–1308, 1995) and in International Publication No. WO 97/01111. In "Measurement Science and Technology", a pulse modulated laser beam is divergently emitted to a measurement subject from a device and the reflected light from the subject is received by a two-dimensional CCD sensor to which an image-intensifier is attached, so that received light energy is converted to electric signals. The shutter operation is carried out with the image-intensifier which is controlled by a gate-pulse, and the gate-pulse is synchronized with the pulse radiation of the laser beam. According to the above construction of the device, the amount of light received during the exposure time at each pixel of the CCD correlates with the distance between the pixel and the corresponding point on the subject, so that electric signals which correspond to the distance of the subject are obtained for each pixel of the CCD.

In International Publication No. 97/01111, a device divergently emits pulse modulated light, such as a laser beam, to a measurement subject and the reflected light is received at the two-dimensional CCD sensor which is assembled with a mechanical shutter or an electro-optical shutter formed by a liquid crystal display, so that received light energy is converted to electric signals. The shutter is controlled at a timing which is different from that of the laser emission. Distance information of the measurement subject is obtained at each pixel of the CCD.

SUMMARY OF THE INVENTION

An object of the present invention is to provide a three-dimensional image-capturing device that has a wide measurement range and the advantage of prompt measurement.

According to the present invention, a three-dimensional image-capturing device is provided that comprises a first light source, a second light source, a two-dimensional imaging device, a light-source control processor, an imaging-device control processor, and a distance-information sensing processor.

The first light source may radiate a pulse-modulated first distance-measurement light beam of a first wavelength to a measurement subject. Similarly, the second light source may radiate a pulse-modulated second distance-measurement light beam of a second wavelength to the measurement subject. The two-dimensional imaging device comprises pixels, including a first and second pixel. The first pixel senses light in a first band that includes the first wavelength and accumulates a corresponding amount of electric charge. The second pixel senses light in a second band, which includes the second wavelength and accumulates a corresponding amount of electric charge. The light-source control processor drives the first and second light sources, so that the emission of the second distance-measurement light beam starts after the start and before the end of the first distance-measurement light beam emission. The imaging-device control processor controls the two-dimensional imaging device, so that electric charges due to the first and second distance-measurement light beams are accumulated at least in one of the first or second pixel, within a predetermined accumulation period. The distance-information sensing processor detects at least one of the reflected light beams of the first or second distance-measurement light beams reflected at the measurement subject, within the accumulation period. Further, it calculates distance information of the measurement subject based on electric charges accumulated in pairs of first and second pixels which are arranged adjacently.

BRIEF DESCRIPTION OF THE DRAWINGS

The objects and advantages of the present invention will be better understood from the following description, with reference to the accompanying drawings in which:

FIG. 7 illustrates an example of a filter array attached to the CCD;

FIG. 11 is a timing chart of a distance correction information sensing operation;

FIG. 12 is a timing chart of a reflectance information sensing operation;

DESCRIPTION OF THE PREFERRED EMBODIMENTS

Figure 1:
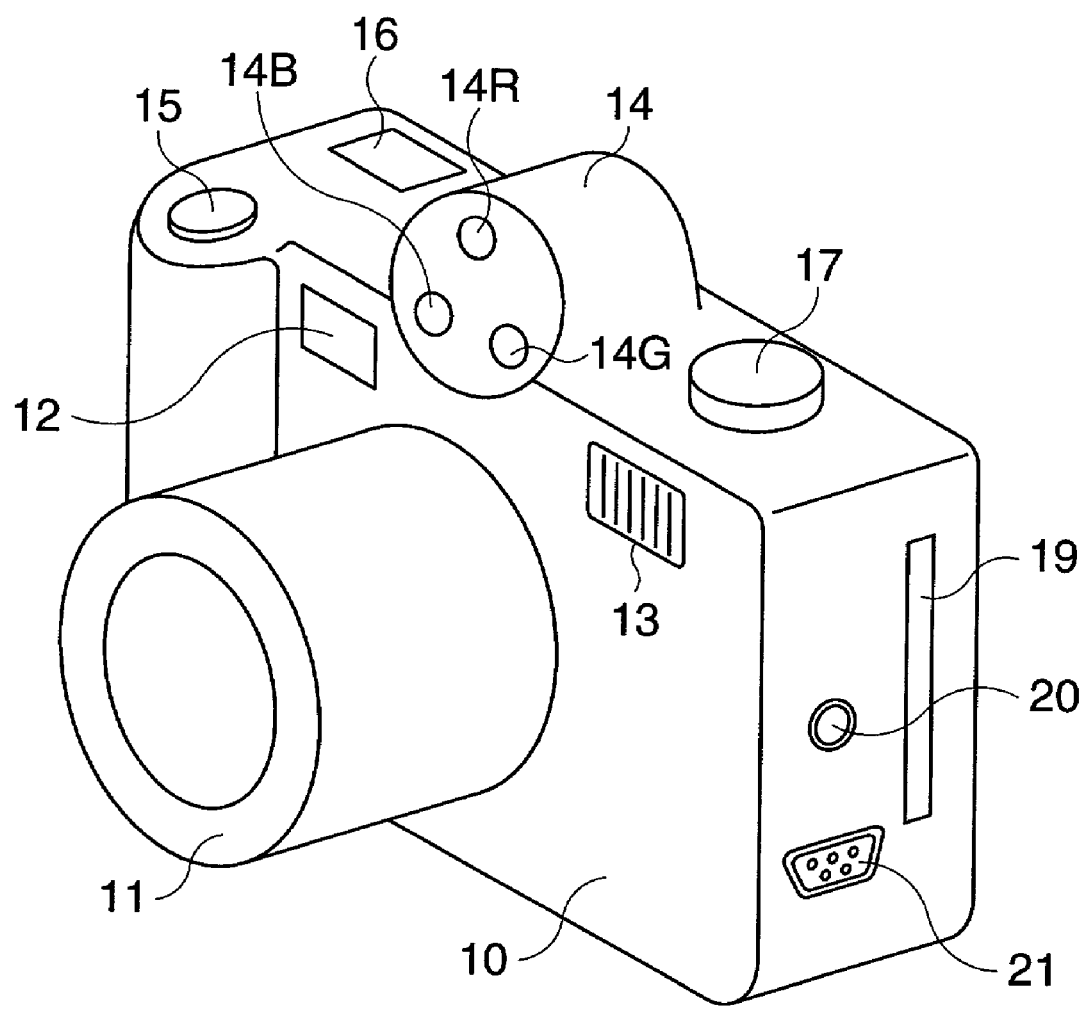
FIG. 1 is a perspective view showing a camera provided with a three-dimensional image-capturing device of the embodiment of the present invention.

The present invention is described below with reference to the embodiments shown in the drawings.

FIG. 1 is an external view of a camera-type three-dimensional device of a first embodiment of the present invention. With reference to FIG. 1, the three-dimensional device of the first embodiment is explained.

On the front surface of the camera body 10, a view-finder window 12 is provided toward the left-upper edge, adjacent to a photographing lens 11, and an electronic flash 13 is disposed toward the right-upper edge. A light-emitting device 14 which radiates laser beams for distance measurement is mounted on the upper surface of the camera body 10, above the photographing lens 11. The light-emitting device 14 comprises a plurality of light sources, for example, light sources 14R, 14G, and 14B. Each of light sources radiates measurement light at a different wavelength. Preferably, the wavelength of the measurement lights emitted from each of the light sources 14R, 14G, and 14B is in the ranges of red (R), green (G), and blue (B), respectively. A release switch 15 and a liquid crystal display panel 16 are provided on the left side of the light-emitting device 14, and a mode change dial 17 is provided on the right side of the device 14. On a side surface of the camera body 10, a card slot 19 is formed, into which a recording medium, such as an IC memory card, is insertable. A video output terminal 20 and an interface connector 21 are also provided on the side surface.

Figure 2:
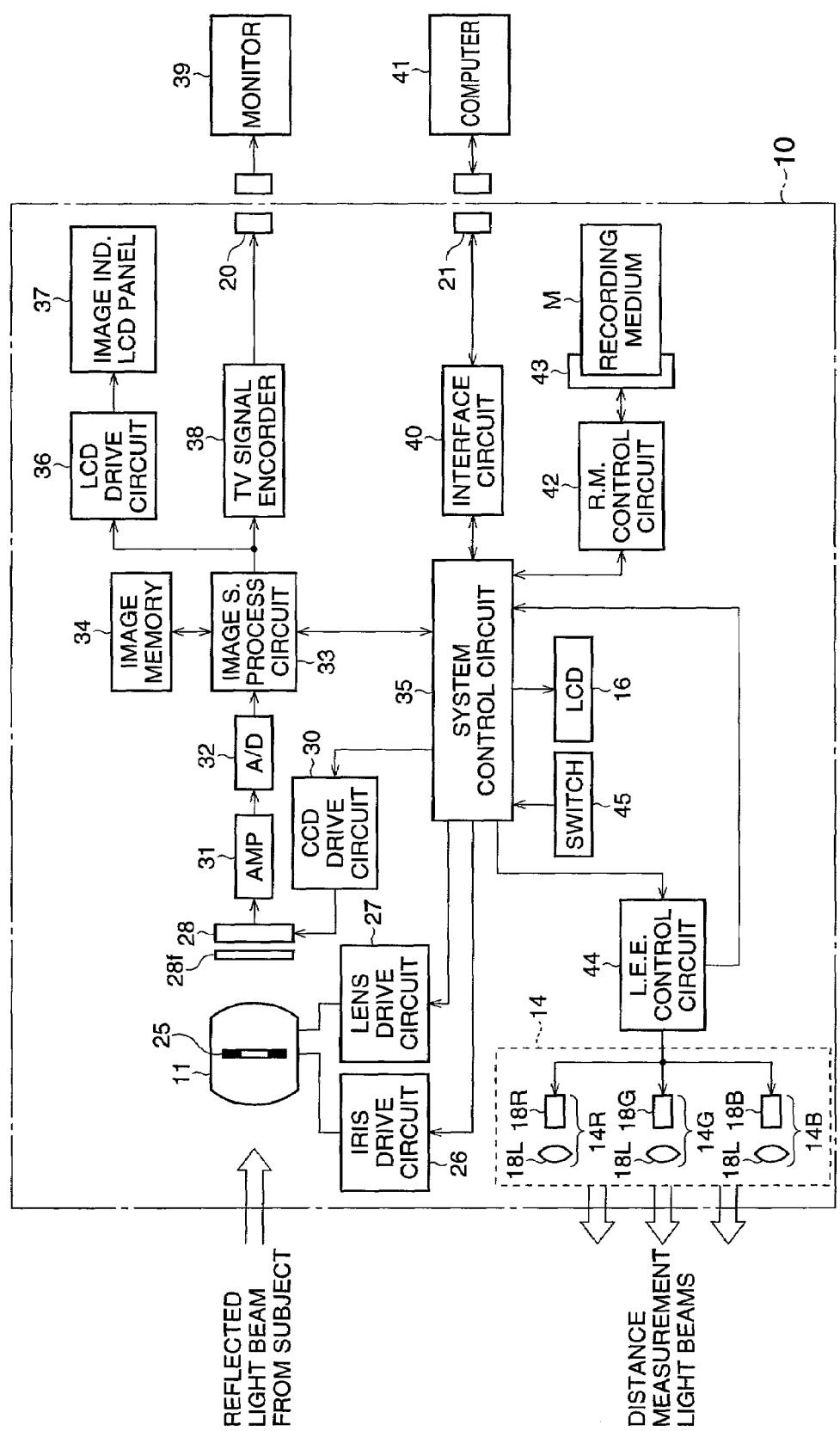
FIG. 2 is a block diagram showing an electrical construction of the camera shown in FIG. 1.

FIG. 2 is a block diagram showing an electrical construction of the camera of FIG. 1.

The aperture 25 is provided in the photographing lens 11. The opening degree of the aperture 25 is adjusted by the iris drive circuit 26. A focusing operation and a zoom operation of the photographing lens 11 are controlled by the lens drive circuit 27.

The CCD (two-dimensional imaging device) 28 with the filter 28f on the imaging surface is disposed on the optical axis of the photographing lens 11. A subject image is formed on the imaging surface of the CCD 28 by the photographing lenses 11, and an electric charge corresponding to the subject image is generated therein. An operation, such as an accumulating operation and a reading operation of the electric charge of the CCD 28, is controlled by CCD drive pulse signals fed from the system control circuit 35 to the CCD drive circuit 30. Electric charge signals, i.e., image signals, output from the CCD 28 are amplified by amplifiers 31, and are converted from analog signals to digital signals by the A/D converter 32. The digital image signals from the A/D converter 32 are subjected to processes, such as a gamma correction and so on, in the image-signal process circuit 33, and are stored as digital image data in the image memory 34. The iris drive circuit 26, the lens drive circuit 27, the CCD drive circuit 30, and the image-signal process circuit 33 are controlled by a system control circuit 35.

The digital image data are read from the image memory 34 and supplied to the LCD drive circuit 36, which is operated in accordance with the digital image data, so that an image corresponding to the digital image data is displayed on the image indicating LCD panel 37.

The digital image data read from the image memory 34 is also transmitted to the TV signal encoder 38, so that the digital image data can be transmitted to a monitor device 39, provided externally to the camera body 10, through the video output terminal 20. The system control circuit 35 is connected to the interface circuit 40 and the interface circuit 40 is connected to the interface connector 21. Therefore, the digital image data read from the image memory 34 can also be transmitted to a computer 41 connected to the interface connector 21 via an interface cable. Further, the system control circuit 35 is connected to an image-recording device 43 through the recording medium control circuit 42. Therefore, the digital image data read from the image memory 34 can be recorded in a recording medium M, such as an IC memory card, attached to the image recording device 43. Further, the image data recorded in the recording medium M may be displayed on the image indicating LCD panel 37 via the system control circuit 35 if required.

A light-emitting element control circuit 44 is connected to the system control circuit 35. The light source 14R, 14G, and 14B of the light-emitting device 14 are provided with light-emitting elements 18R, 18G, 18B and illumination lenses 18L. The light-emitting elements 18R, 18G, and 18B can be laser diodes, for example. The operation of the light emitting elements 18R, 18G, and 18B is controlled by the light-emitting element control circuit 44. The light emitting elements 18R, 18G, and 18B respectively radiate R, G, and B laser beams as distance-measurement light beams and the beams are diverged by the illumination lenses 18L, so that each diverged laser beam irradiates the entire measurement subject. The laser beams reflected by the measurement subject become incident on the photographing lens 11 and the reflected laser beams are detected by the CCD 28. As will be discussed later, the distance from the camera 10 to the measuring subject that corresponds to each of the pixels in the CCD 28 is obtained from the image signals detected at each pixel of the CCD 28.

A switch group 45, including the release switch 15 and the mode change dial 17, and the liquid crystal display panel (indicating device) 16 are connected to the system control circuit 35.

Figure 3:
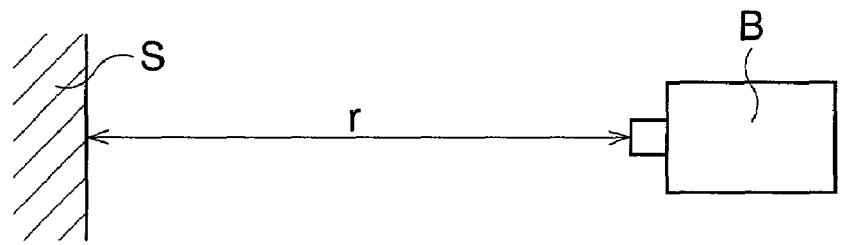
FIG. 3 is a view showing the principle behind distance measurement.
Figure 4:
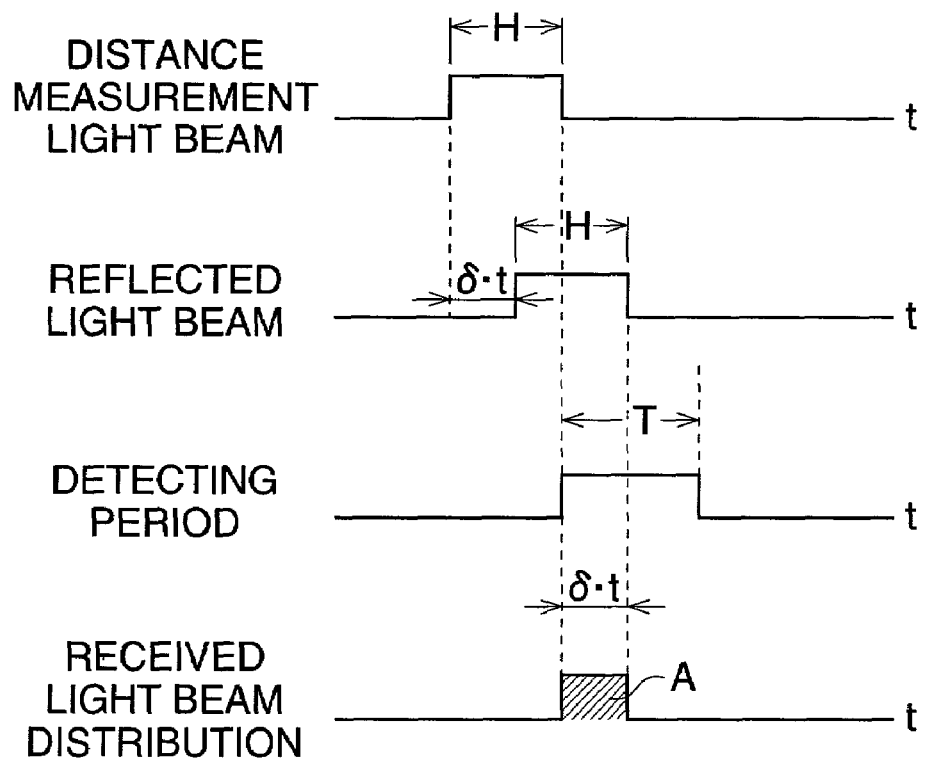
FIG. 4 is a timing chart showing a distance-measurement light beam, reflected light beam, a gate pulse, and the distribution of the accumulated amount of light received by a CCD.

With reference to FIGS. 3 and 4, the principle behind the distance measurement in the embodiment is described below. Note, in FIG. 4, the abscissa indicates time "t".

A distance-measurement light beam output by the distance-measurement device B is reflected by the measurement subject S, and the reflected light beam is sensed by a CCD (not shown). The distance-measurement light beam is emitted as a pulse beam of width "H", so that the reflected light has the same pulse width "H". However, the leading edge of the pulse of the reflected light beam is delayed δ·t (δ is a delay coefficient) from the leading edge of the pulse of the distance-measurement light beam. Since the distance-measurement light beam and the reflected light beam have both traveled a distance "r" between the distance measurement device B and the measured subject S, the distance "r" is represented as follows:

$$r = \delta \cdot t \cdot C / 2 \quad (1)$$

wherein "C" is the speed of light.

For example, the reflected light beam detecting period T is set in such a manner that the reflected light beam can only be sensed from the point when the pulse of the distance-measurement light beam falls to a point after the fall of the pulse of the reflected light beam. Namely, the reflected light beam detecting period T is set in order to detect the rise of the reflected light pulse at the CCD before the reflected light beam detecting period starts and to detect the fall during the reflected light beam detecting period. As shown in FIG. 4, an amount "A" of reflected light received during the reflected light beam detecting period T becomes a function of the distance "r". Namely, the greater the distance "r" (or the greater the time δ·t), the greater the received light amount "A", so that the distance "r" is derived from the amount "A".

In the present embodiment, by taking advantage of the principle described above, the distance information which represents the three-dimensional shape of a measurement subject S is obtained in accordance with the received light amount "A" sensed in each of the photo-diodes which are two-dimensionally disposed on the CCD 28. Namely, from the received light amount "A" detected in each of the photo-diodes or pixels, the distance from the camera body 10 to each point on the surface of the measurement subject S is sensed as an image signal (a three-dimensional image) for each of the photo-diodes or pixels.

Figure 5:
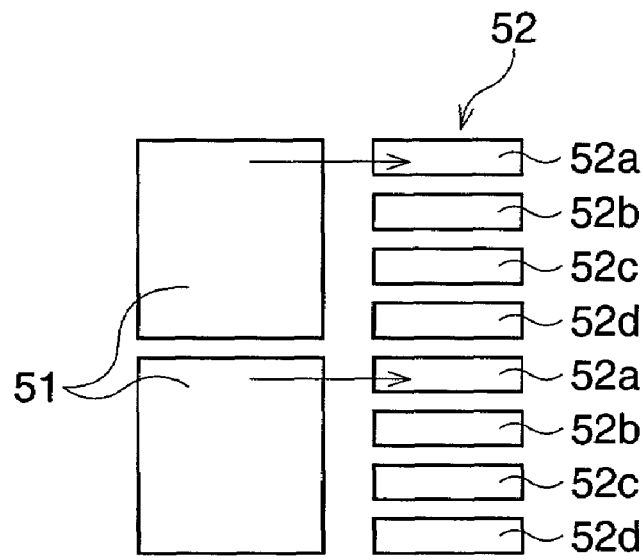
FIG. 5 is a plan view showing a disposition of the photo-diodes and vertical transfer unit, which are provided in the CCD.
Figure 6:
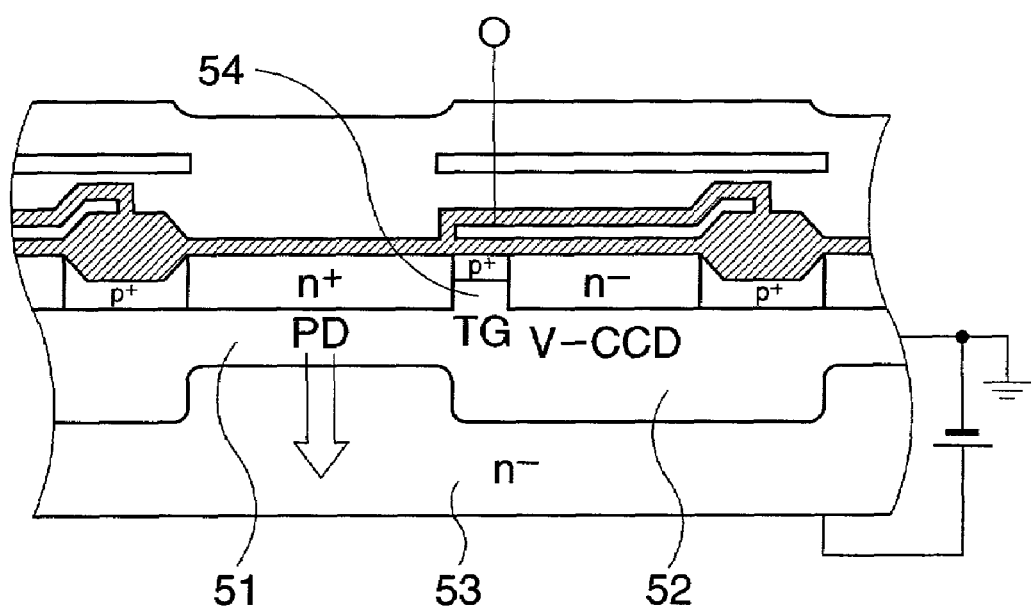
FIG. 6 is a sectioned elevational view of the CCD.

FIG. 5 is a plan view showing the disposition of the photo-diodes 51 and a vertical transfer unit 52, which are provided in the CCD 28. Actually, a multitude of photo-diodes 51 are arranged in a matrix, and a corresponding vertical transfer unit 52 is disposed beside each vertical column of photo-diodes 51. FIG. 6 is a sectioned elevational view of the CCD 28 in which the CCD 28 is cut by a plane perpendicular to a substrate 53. An example of the CCD 28 is an interline CCD, a vertical overflow drain (VOD) type, in which unwanted charge is discharged to the substrate 53.

The photo-diodes 51 and the vertical transfer unit (signal charge holding unit) 52 are formed along a surface of the n-type substrate 53. A plurality of photo-diodes 51 are two-dimensionally disposed in a matrix arrangement, and the vertical transfer unit 52 is disposed adjacent to the photo-diodes 51, parallel to rows extending in a vertical direction in FIG. 5. The vertical transfer unit 52 has four vertical transfer electrodes 52a, 52b, 52c and 52d, which correspond to each of the photo-diodes 51. Therefore, in the vertical transfer unit 52, four potential wells can be formed, so that a signal charge is output from the CCD 28 by controlling the depth of the wells, as is well known. Note that a number of the vertical transfer electrodes can be changed, depending upon the requirement of the CCD 28.

The photo-diodes (PD) 51 and the vertical transfer unit (signal charge holding unit) 52 are disposed in a p-type well formed on a surface of the substrate 53. The p-type well is completely depleted due to an inverse bias voltage applied between the p-type well and the n-type substrate 53. In this state, electric charge is accumulated in the photo-diodes 51, and the amount of the electric charge corresponds to the amount of incident light, which is the reflected light, reflected by the measurement subject. When a substrate voltage is changed to a value greater than a predetermined value, electric charge accumulated in the photo-diodes 51 is discharged to the substrate 53. Conversely, when an electric charge transfer signal, which is a voltage signal, is applied to a transfer gate (TG) 54, the electric charge accumulated in the photo-diodes 51 is transferred to the vertical transfer unit 52. Namely, after the electric charge is discharged to the substrate 53 by the electric charge discharging signal, the signal charge accumulated in the photo-diode 51 is transferred to the vertical transfer unit 52 by the electric charge transfer signal. By repeating the discharge and the transfer, an electronic shuttering operation is performed.

Figure 7:
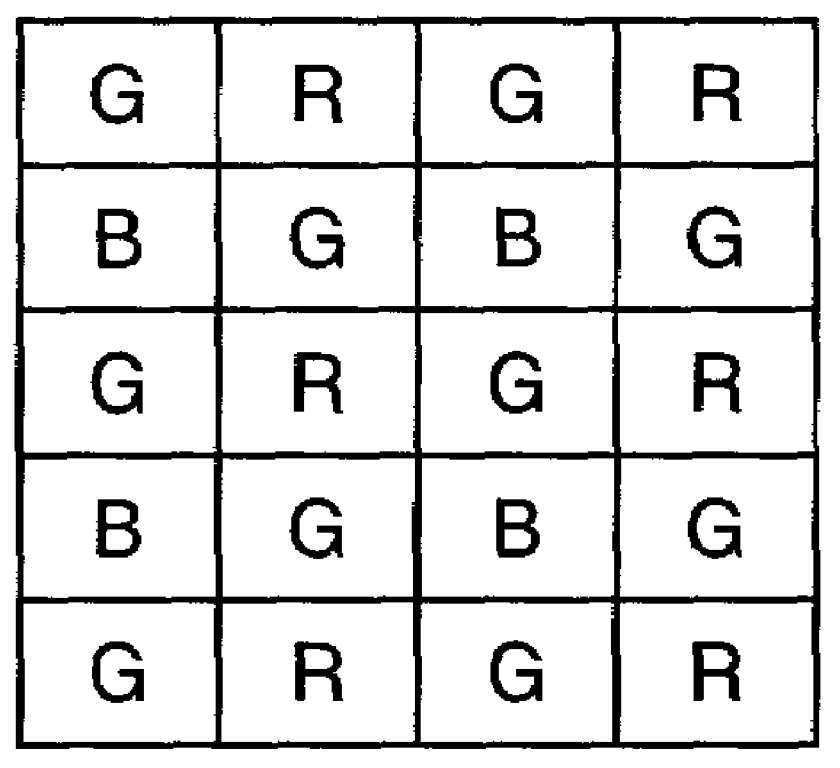

FIG. 7 illustrates an example of the filter 28f mounted on the CCD 28. The filter 28f has the Bayer type color filter array which arranges primary colors, such as R, G, and B. In the FIG. 7, only a part of the array is shown. The area with the letters "R", "G", and "B" represent the red (R) filter, green (G) filter, and blue (B) filter, respectively. The R, G, and B color filters are disposed on each of the photo-diodes 51 of the CCD 28, which are arranged two-dimensionally. Namely, transmitted light of the R color filter is only made incident on the photo-diodes with the R color filter and detected. Likewise, on the photo-diodes attached with the G and B color filters, transmitted light of the respective G and B color filter is only made incident and detected. Note that, color data for an image pixel is derived from RGB signals of the neighboring photo-diodes.

Figure 8:
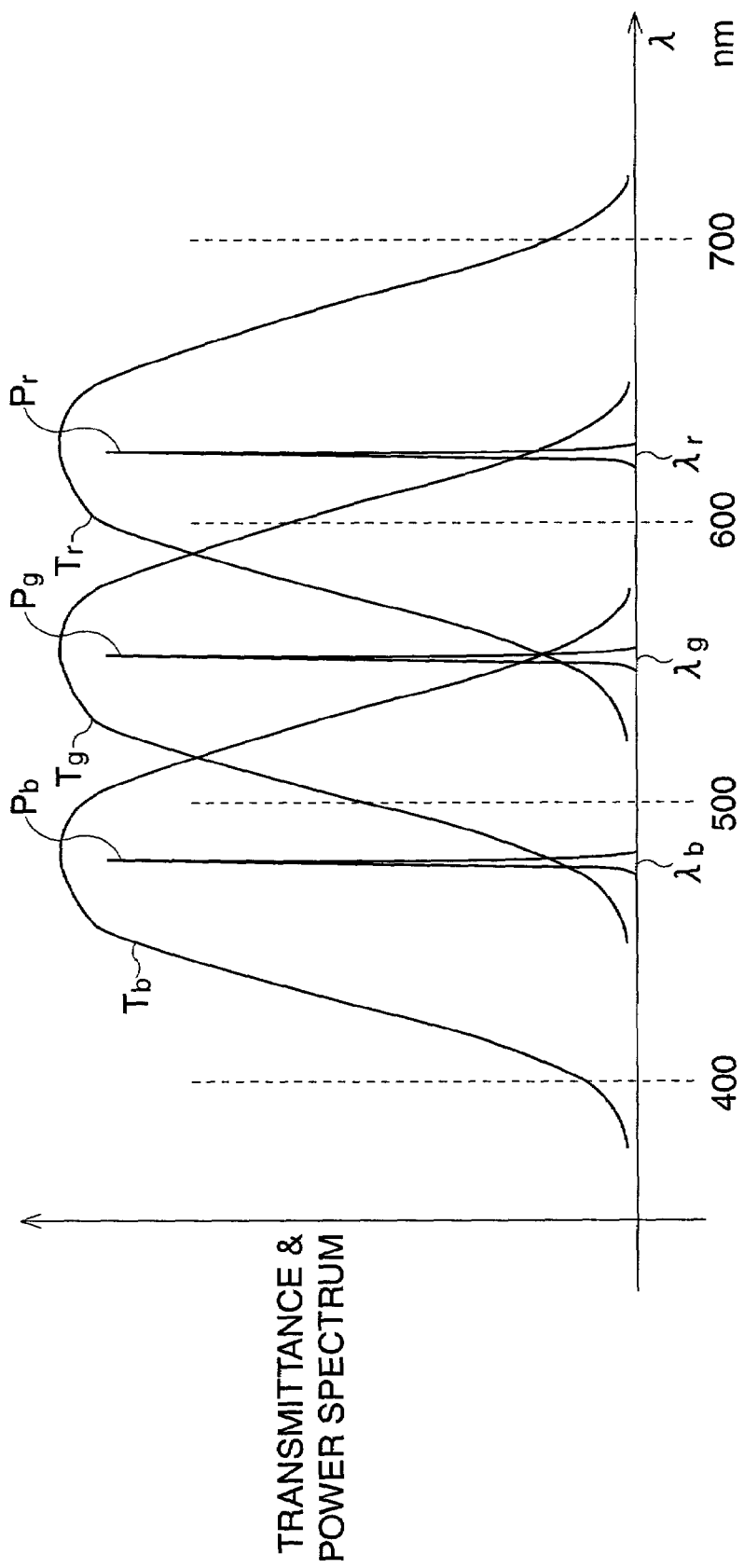
FIG. 8 illustrates the spectral transmittance characteristics of band transmission filters or R, G, and B color filters in the filter array of the CCD.

FIG. 8 shows an example of spectral transmittance characteristics of the band transmission filters, i.e., the R, G, and B color filters. The curved lines or characteristic lines Tr, Tg, and Tb designate the spectral transmittance characteristics of the R, G, and B color filters, respectively. Each characteristic line Tr, Tg, and Tb has the peak at wavelength λr, λg, and λb, respectively. FIG. 8 also shows an example of the power spectrum of the distance-measurement light beams emitted from the light sources 14R, 14G, and 14B. The respective characteristic lines Pr, Pg, and Pb designate the spectral characteristics of the light sources 14R, 14G, and 14B. The spectral characteristic of each light source 14R, 14G, and 14B has an extreme peak at the wavelength λr, λg, and λb, respectively. Therefore, a distance-measurement light beam that is radiated from the light source 14R is received and detected only at the photo-diodes 51 to which the R color filter is attached, while the photo-diodes 51 with the G or B color filters hardly receive any of the beam from the light source 14R. Similarly, a distance-measurement light beam that is radiated from the light source 14G is received and detected only at the photo-diodes 51 to which the G color filter is attached, while the photo-diodes 51 with the R or B color filters hardly receive any of the beam from the light source 14G, and a similar situation exists for the distance-measurement light beam from the light source 14B.

Figure 17:
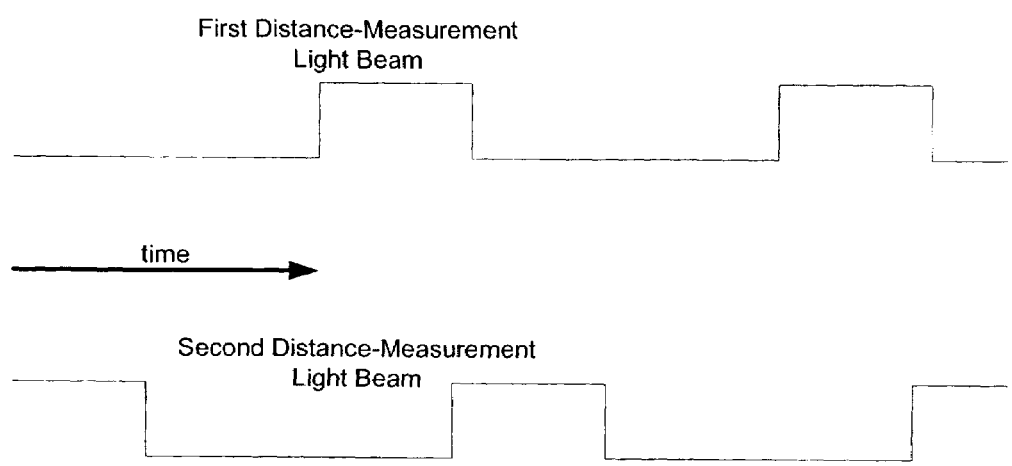
FIG. 17 is the timing chart for a distance information emitting operation by which a first light-source control processor drives first and second light sources, so that an emission of a second distance-measurement light beam begins after a start, but before an end and substantially simultaneously with an emission of a first distance-measurement light beam.

FIG. 17 is a timing chart for a distance information emitting operation by which a first light-source control processor drives first and second light sources, so that an emission of a second distance-measurement light beam begins after a start, but before an end and substantially simultaneously with an emission of a first distance-measurement light beam.

Figure 9:
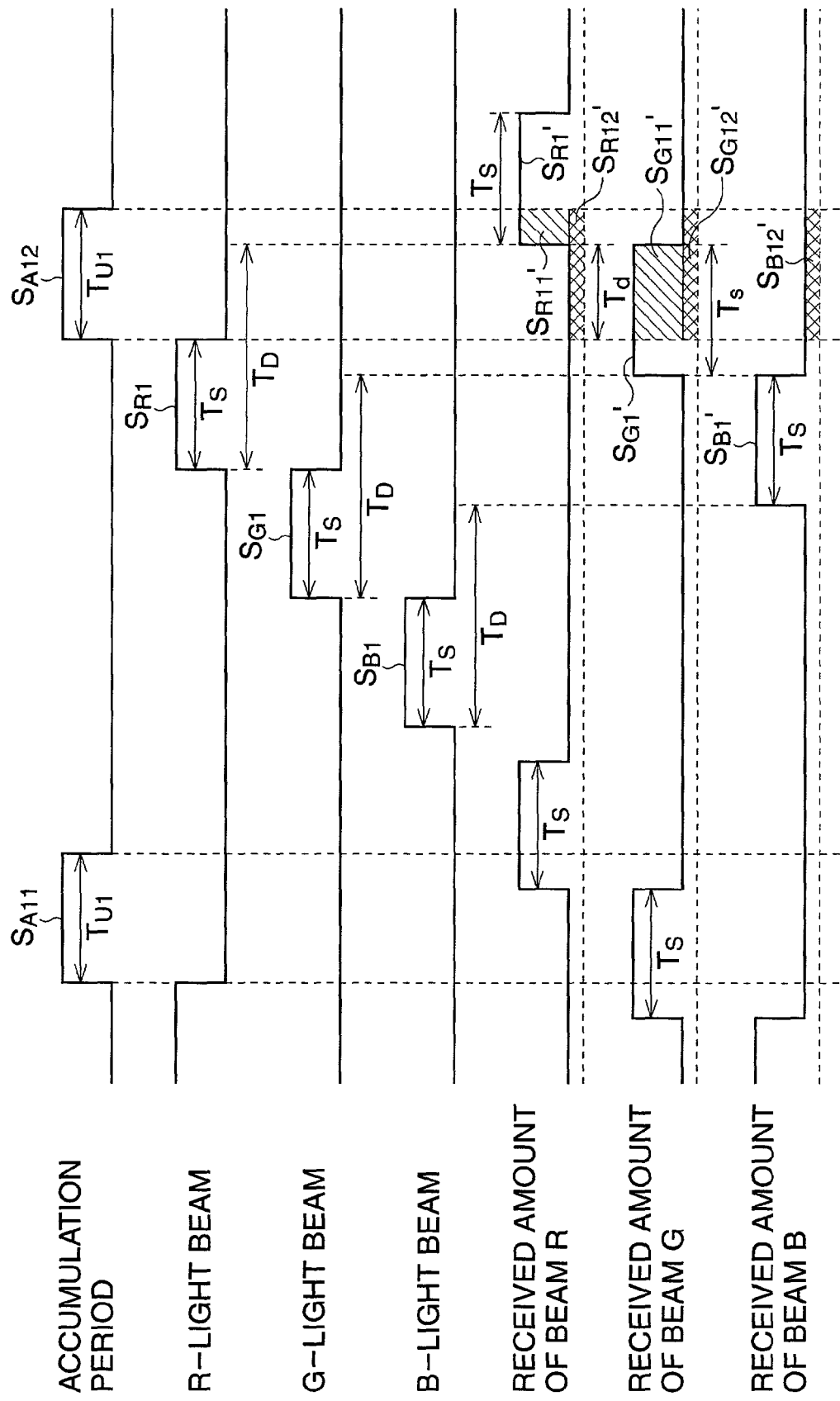
FIG. 9 is the timing chart for a distance-information sensing operation by which data, corresponding to a distance from a camera body to each point on a surface of the measurement subject, is sensed.

With reference to FIG. 9, a distance-information sensing operation of the present embodiment is explained. The measurement of a measurement subject based on the above principle, which is described with reference to FIG. 3 and FIG. 4, requires an extremely high-speed shutter operation, so that an insufficient signal output is obtained in a single shutter operation. Therefore, in the distance-information sensing operation of the present embodiment, the above shutter operation may be repeated for one field period for a predetermined numbers of times, so that signal electrical charges are integrated in the vertical transfer unit 52 and a large signal output is obtainable. FIG. 9 illustrates a timing chart of the distance-information sensing operation of the present embodiment, which integrates signal charges in the vertical transfer unit 52.

When a vertical synchronizing signal (not shown) is output, a field period (a period between two vertical synchronizing signals) which is not restricted to 1/60 of a second, starts. Then in the CCD 28 drive operation, accumulation periods equaling the period $T_{U1}$ repeatedly take place at a predetermined timing by means of the electronic shutter operations descried above. Therefore signal charge which corresponds to the amount of light received during each accumulation period is accumulated in each of the photo-diodes 51. In FIG. 9, the abscissa indicates time and two accumulation periods $S_{A11}$ and $S_{A12}$ are shown as an example of the accumulation periods which are repeated during one field period. In synchronization with the accumulation periods, pulses of R, G, and B distance-measurement light beams $S_{R1}$, $S_{G1}$, and $S_{B1}$, in which each of the beams has a predetermined pulse width $T_S$, are emitted from the light sources 14R, 14G, and 14B. The distance-measurement light beams $S_{R1}$, $S_{G1}$, and $S_{B1}$, are emitted in the interval between the accumulation periods $S_{A11}$ and $S_{A12}$, in the order $S_{B1}$, $S_{G1}$, and $S_{R1}$, for example. The beams $S_{R1}$, $S_{G1}$, and $S_{B1}$ are continuously output, so that there is no rift between the beams. In the present embodiment, the distance-measurement light beam $S_{G1}$ is output approximately simultaneously with the end of the distance-measurement light beam $S_{B1}$ emission and the distance-measurement light beam $S_{R1}$ is output approximately simultaneously with the end of the distance-measurement light beam $S_{G1}$ emission. Further, in the present embodiment, the output of the distance-measurement light beam $S_{R1}$ completes just before the accumulation period $S_{A12}$ starts.

Each of the distance-measurement light beams $S_{R1}$, $S_{G1}$, and $S_{B1}$ are reflected on the surface of the measurement subject and then received by each of the photo-diodes to which the R, G, and B color filters are attached. The pulses $S_{R1}'$, $S_{G1}'$, and $S_{B1}'$ represent an amount of the light received at the photo-diodes which have the R, G, and B color filter. Namely, the pulses $S_{R1}'$, $S_{G1}'$, and $S_{B1}'$ correspond to the distance-measurement light beams $S_{R1}$, $S_{G1}$, and $S_{B1}$, respectively. As shown in the FIG. 9, a part of the pulse $S_{R1}'$ and $S_{G1}'$, which corresponds to the distance-measurement light beam $S_{R1}$ and $S_{G1}$, is received during the accumulation period $S_{A12}$. The hatched portions $S_{R11}'$, $S_{R12}'$, $S_{G11}'$, $S_{G12}'$, and $S_{B12}'$ represent the amount of light received at each of the above photo-diodes in the accumulation period $S_{A12}$. Namely, in each of the photo-diodes of the CCD 28, a signal charge that corresponds to the above received light amount is detected. Note that, signal charges represented by the hatched portions $S_{R11}'$ and $S_{G11}'$ are due to the distance-measurement light beams, which are reflected by a measurement subject, and the signal charges of the hatched portions $S_{R12}'$, $S_{G12}'$, and $S_{B12}'$ are due to ambient daylight.

The photo-diodes which receive the respective pulse beams $S_{R1}'$, $S_{G1}'$, and $S_{B1}'$ in FIG. 9 are disposed adjacent to each other, so that they may compose a set for one picture element. Therefore, the distance traveled by each of the distance-measurement light beams $S_{R1}$, $S_{G1}$, and $S_{B1}$, which are reflected by a measurement subject and received by the photo-diodes, is approximately the same. Namely, in the example shown in FIG. 9, the time required for each of the distance-measurement light beams $S_{R1}$, $S_{G1}$, and $S_{B1}$ to reach each of the photo-diodes is $T_D=T_S+T_d$. Since the period TD corresponds to the period $\delta \cdot t$ of the formula (1), the distance from the photo-diodes to a measurement subject can be derived from the calculation of the period $T_D$. The pulse width $T_S$ of a distance-measurement light beam is predetermined, thus the distance from the photo-diodes to a measurement subject is calculated from the determination of the period $T_d$ which corresponds to the signal charge of the hatched portion $S_{G11}'$. Note that, the method for calculating the above distance will be detailed later.

In the CCD 28, signal charges that correspond to distances from the photo-diodes 51 to a measurement subject are accumulated in each of the photo-diodes 51. Signal charges, which are accumulated in each of the photo-diodes 51 of the CCD 28, are transferred to the vertical transfer units 52 every time an accumulation periods elapses. Although in the above description, the distance-measurement light beam emission, the signal charge accumulation, and transfer operations are explained only with reference to the accumulation period $S_{A12}$, the same operations are performed for the accumulation period $S_{A11}$ or the other accumulation periods which take place in the field period, as well. As a result, signal charges accumulated in each accumulation period are integrated for one field period at the vertical transfer units 52. The signal charge integrated for one field period corresponds to distance information of the measurement subject, on the condition that the measurement subject is stationary for the period. Note that, timing of the distance-measurement light beam emission may be adjusted in accordance with the measurement range for a measurement subject, so that the timing is not restricted to that designated in FIG. 9. Further, although the above signal-charge detecting operation was described in relation to the photo-diodes with R, G, and B filters attached, the operation is carried out in every photo-diode 51. As a result of the detecting operation for one field period, the distance information sensed by the photo-diodes 51 is held in each corresponding vertical transfer unit 52, which is located adjacent to each column of photo-diodes 51. The distance information is output from the CCD 28 by a vertical transferring operation of the vertical transfer units 52 and a horizontal transferring operation of a horizontal transfer unit (not shown).

Figure 10A:
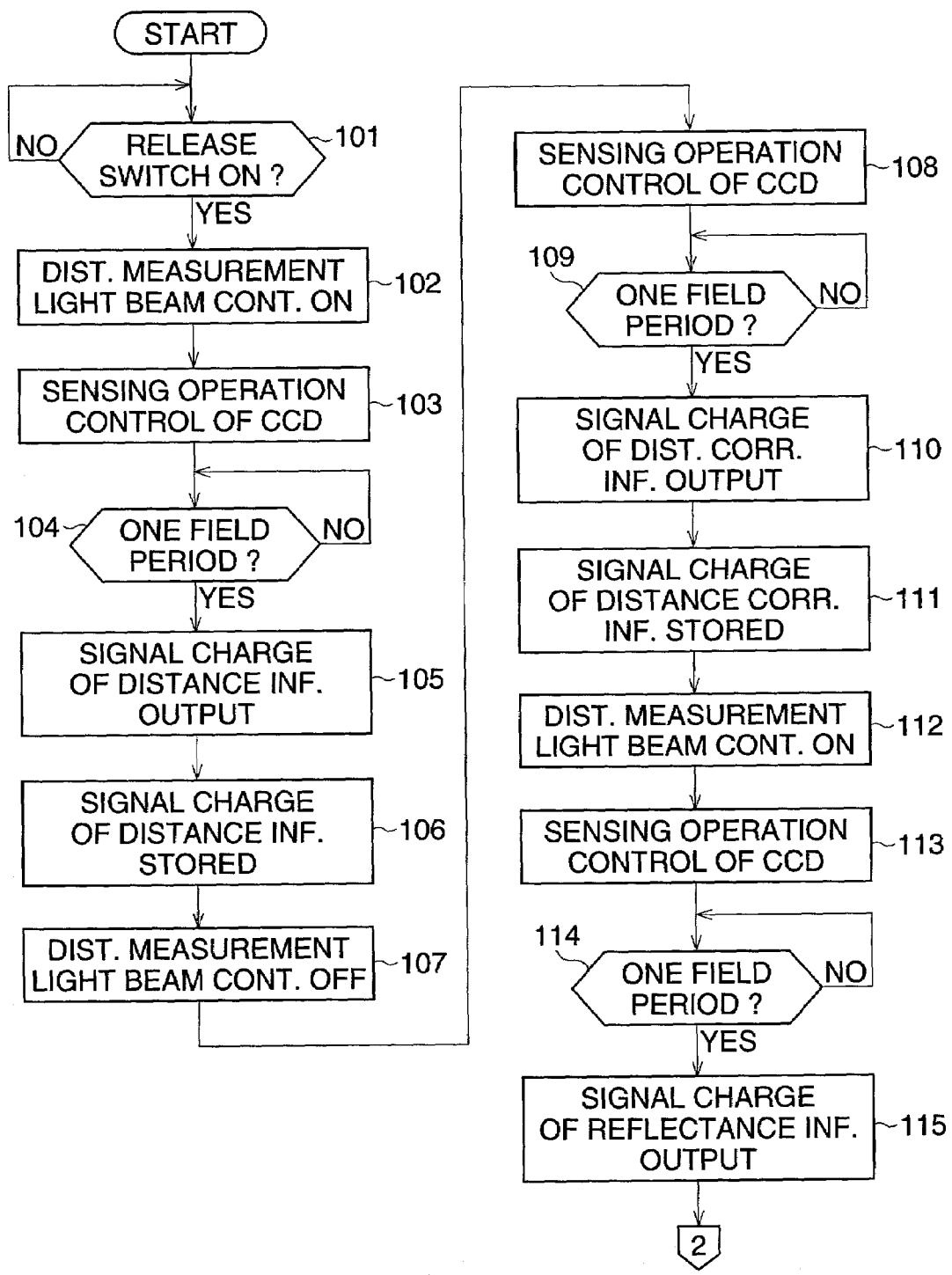
FIGS. 10A and 10B show a flowchart of the distance-information sensing operation.
Figure 10B:
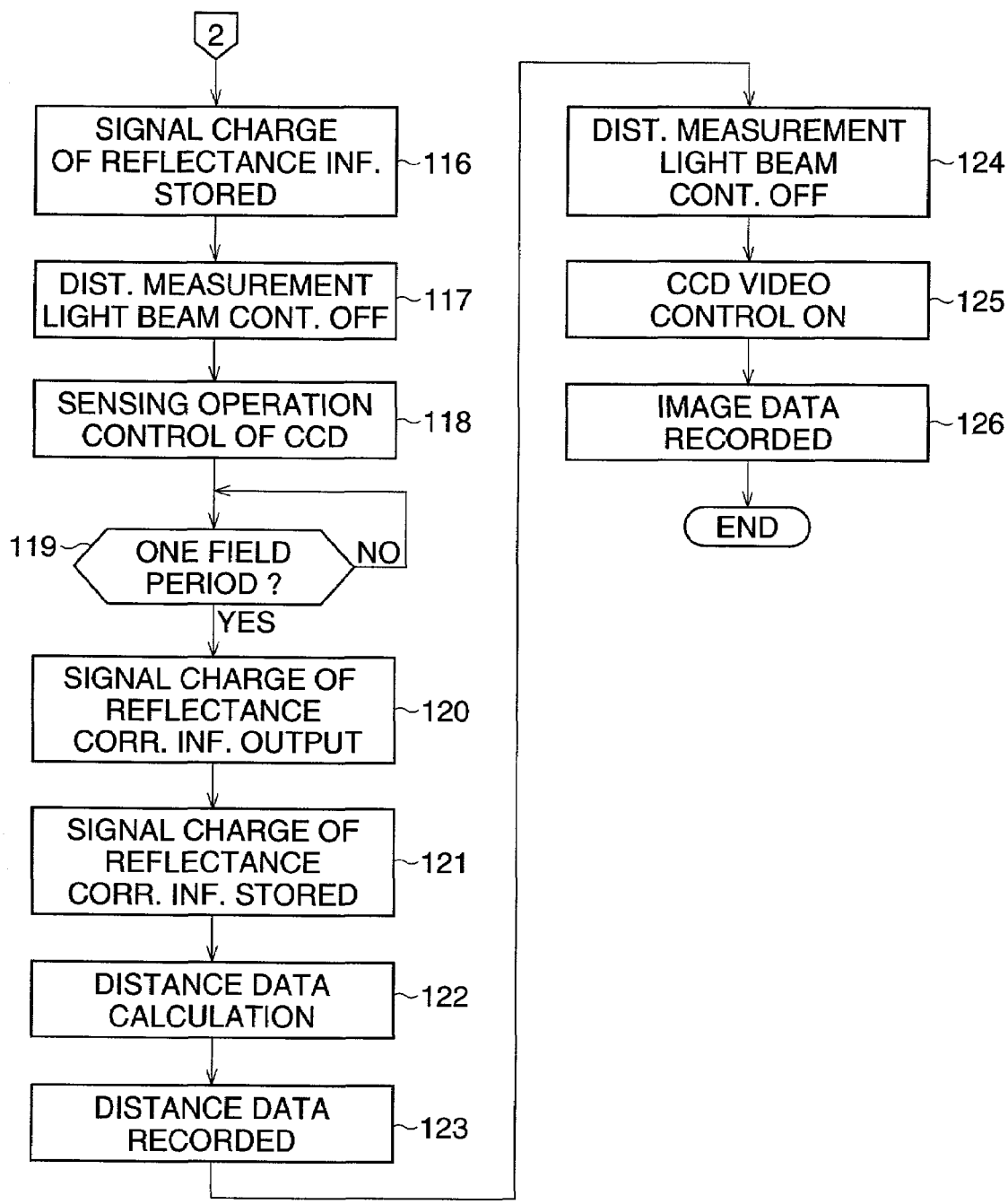

However, the reflected light beam, sensed by the CCD 28, may be affected by the reflectance of the surface of a measurement subject. Therefore, the distance information, obtained through the reflected light beam, may contain an error resulting from the reflectance. Further, as described in FIG. 9, the reflected light beam sensed by the CCD 28 may contain an extra component, such as ambient daylight, being other than the reflected light beam from the measurement subject, which can cause an error. Operations for correcting such errors will be described below with reference to the flow chart of the distance-information sensing operation, the FIGS. 10A and 10B, and the timing charts in FIGS. 11 through 16.

When it is recognized in Step 101 that the release switch 15 is fully depressed, Step 102 is executed in which a vertical synchronizing signal is output and a distance-measurement light beam control is started. Namely, the light sources 14R, 14G, and 14B of the light-emitting device 14 are driven so that the pulse modulated distance-measurement light beams (for example $S_{R1}$, $S_{G1}$, and $S_{B1}$) are output according to the timing indicated in FIG. 9. Then, Step 103 is executed so that a sensing operation control of the CCD 28 is started. Namely, the distance-information sensing operation described with reference to FIG. 9 is started, and thus the electric charges corresponding to the light amount of the hatched portions and which relate to the distances from the photo-diodes to a measurement subject, are integrated in the vertical transfer units 52.

In Step 104, it is determined whether one field period has elapsed since the beginning of the distance-information sensing operation, i.e., whether a new vertical synchronizing signal has been output. When one field period has passed, the process goes to Step 105 in which the signal charges of the distance information are output from the CCD 28. The signal charges are then temporally stored in the image memory 34 in Step 106. Then, in Step 107, the distance-measurement light beam control is turned OFF, and thus the light emitting operation of the light emitting device 14, i.e., the light sources 14R, 14G, and 14B, is stopped.

In Steps 108 through 111, the distance correction information sensing operation is performed. In Step 108, a vertical synchronizing signal is output, and then a sensing operation control of the CCD 28 is started. Namely, as shown in FIG. 11, without the light emitting operation of the light emitting device 14, i.e., while the light sources 14R, 14G, and 14B are in the OFF state, the above described electronic shutter operation is carried out repeatedly and the accumulation periods $S_{A2}$ of the period $T_{U1}$ take place at the same timing described in FIG. 9. In the distance correction information sensing operation (FIG. 11), since the R, G, and B distance-measurement light beams do not irradiate the measurement subject, there is no reflected light due to the R, G, and B measurement light beams. Therefore, no signal charge for the distance information is generated during each of the accumulation periods $S_{A2}$. However, since the noise component, such as ambient daylight, enters the CCD 28, signal charges $S_{R22}'$, $S_{G22}'$, and $S_{B22}'$ corresponding to an interference or noise component are generated in the photo-diodes 51 with the R, G, and B color filters. The signal charges $S_{R22}'$, $S_{G22}'$, and $S_{B22}'$ correspond to distance correction information, which is used for correcting an error generated in the distance information due to the noise component, and is related to the accumulation period $T_{U1}$. Note that, the accumulation operation of the signal charges $S_{R22}'$, $S_{G22}'$, and $S_{B22}'$ in the accumulation period $S_{A2}$ is repeated for one field period, thus the signal charges are held and integrated in the vertical transfer unit 52.

In Step 109, it is determined whether one field period has elapsed since the beginning of the distance correction information sensing operation, i.e., whether a new vertical synchronizing signal has been output.

When one field period has passed, the process goes to Step 110 in which the signal charges $S_{R22}'$, $S_{G22}'$, and $S_{B22}'$ of the distance correction information are output from the CCD 28. The signal charges $S_{R22}'$, $S_{G22}'$, and $S_{B22}'$ of the distance correction information are then temporally stored in the image memory 34 in Step 111.

In Steps 112 through 116, the reflectance information sensing operation is performed. In Step 112, a vertical synchronizing signal is output, and then the distance-measurement light beam control of the light-emitting device 14 is started. As shown in FIG. 12, in the reflectance information sensing operation, being different from the distance-information sensing operation described with FIG. 9, the pulse modulated distance-measurement light beams $S_{R2}$, $S_{G3}$, and $S_{B3}$ are intermittently emitted from each of the R, G, and B light sources 14R, 14G, and 14B, simultaneously. The pulse width $T_S$ of the distance-measurement light beams $S_{R3}$, $S_{G3}$, and $S_{B3}$ is equal to the pulse width of the distance-measurement light beam $S_{R1}$, $S_{G1}$, and $S_{B1}$, which are shown in FIG. 9. In Step 113, the sensing operation control of the CCD 28 is started. Namely, as described in FIG. 12, the electronic shutter operation is carried out at predetermined times after the output of the distance-measurement light beams from the light sources 14R, 14G, and 14B, and the accumulation period $S_{A3}$ of duration $T_{U2}$ is provided. The reflectance information sensing operation is controlled so that all of the reflected light beams $S_{R3}$, $S_{G3}$, and $S_{B3}$ from the light-emitting device 14 are received within the accumulation period $S_{A3}$. Namely, the signal charges $S_{R3}'$, $S_{G3}'$, and $S_{B3}'$ (that correspond to the distance-measurement light beams $S_{R3}$, $S_{G3}$, and $S_{B3}$, and have the same pulse width $T_S$ as the distance-measurement light beams) and the signal charges $S_{R32}'$, $S_{G32}'$, and $S_{B32}'$ (that are indicated with the hatched portions) are accumulated in each of the R, G, and B photo-diodes 51 of the CCD 28. The signal charges described with the hatched portions are the charges generated by the ambient daylight, which is made incident to each of the photo-diodes during the accumulating period $S_{A3}$.

Therefore, the signal charges $S_{R3}'$, $S_{G3}'$, and $S_{B3}'$ do not depend upon the distance "r" of the measurement subject, and correspond only to the reflectance information which depends on the reflectance of the surface of the measurement subject. The accumulating operations for the signal charges $S_{R3}'$, $S_{G3}'$, and $S_{B3}'$ which correspond to the reflectance information, and the signal charges $S_{R32}'$, $S_{G32}'$, and $S_{32}'$, which correspond to the ambient daylight component, are carried out repeatedly for one field period so that the signal charges are held and integrated in the vertical transfer units 52.

In Step 114, it is determined whether one field period has elapsed since the beginning of the reflectance information sensing operation, i.e., whether a new vertical synchronizing signal has been output. When one field period has passed, the process goes to Step 115 in which the signal charges $S_{R3}'$, $S_{G3}'$, and $S_{B3}'$ of the reflectance information and the signal charges $S_{R32}'$, $S_{G32}'$, and $S_{B32}'$ of the ambient daylight component are output from the CCD 28. These signal charges are then temporally stored in the image memory 34 in Step 116. Then, in Step 117, the distance-measurement light beam control is turned OFF, and thus the light emitting operation of the light-emitting device 14, which comprises the light sources 14R, 14G, and 14B, is stopped.

In Steps 118 through 121, the reflectance correction information sensing operation is performed. In Step 118, a vertical synchronizing signal is output, and the sensing operation control of the CCD 28 is started. Namely, as described in FIG. 13, the electronic shutter operation is carried out at predetermined times while the light emitting operation of the light-emitting device 14 is not carried out, or while the light sources 14R, 14G, and 14B are kept in the OFF state, and the accumulation period $S_{A4}$ of duration $T_{U2}$ is provided. In the reflectance correction information sensing operation (FIG. 13), since the R, G, and B distance-measurement light beams do not irradiate the measurement subject, there is no reflected light due to the R, G, and B distance-measurement light beams. Therefore, signal charges of the reflectance information are not generated. However, the signal charges $S_{R42}'$, $S_{G42}'$, and $S_{B42}'$ corresponding to an interference component or a noise component are generated, since the noise component, such as ambient daylight, is made incident to the photo-diodes attached with the R, G, and B color filters. The signal charges $S_{R42}'$, $S_{G42}'$, and $S_{B42}'$ correspond only to reflectance correction information, which is used for correcting an error generated in the reflectance information due to the noise component, and which is related to the accumulation period $T_{U2}$. Note that, the accumulating operations for the signal charges $SR_{42}'$, $S_{G42}'$, and $S_{B42}'$, are carried out repeatedly for one field period so that the signal charges are held and integrated in the vertical transfer units 52.

In Step 119, it is determined whether one field period has elapsed since the beginning of the reflectance correction information sensing operation, i.e., whether a new vertical synchronizing signal has been output. When one field period has passed, the process goes to Step 120 in which the signal charges $S_{R42}'$, $S_{G42}'$, and $S_{B42}'$ of the reflectance correction information are output from the CCD 28. The signal charges $S_{R42}'$, $S_{G42}'$, and $S_{B42}'$ are temporally stored in the image memory 34 in Step 121.

In Step 122, a calculation process of the distance measurement data is performed using the distance information, the distance correction information, the reflectance information, and the reflectance correction information, which are obtained in Steps 102 through 121. The distance measurement data calculated in Step 122 may be recorded in the recording medium M (refer FIG. 1) in Step 123.

In Step 124, the distance-measurement light beam control is turned OFF, and then the normal still video control of the CCD 28 is turned ON in Step 125, so that a color still image of the measurement subject is captured. In Step 126, the image data of the captured color still image may be recorded in the recording medium M, and then the program for the distance-information sensing operation ends.

With reference to FIG. 9 and FIGS. 11 through 16, the contents of the calculation executed in Step 122 will be described below.

Figure 14:
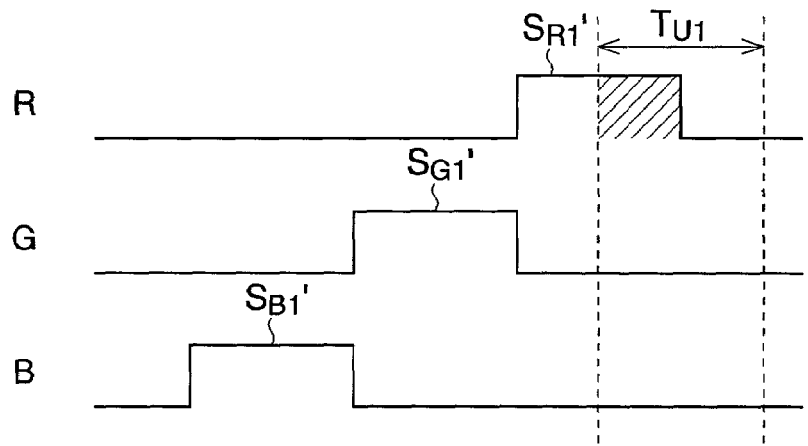
FIG. 14 shows the timing of reflected light beams to be received at the CCD when a measurement subject is disposed at a short range.
Figure 15:
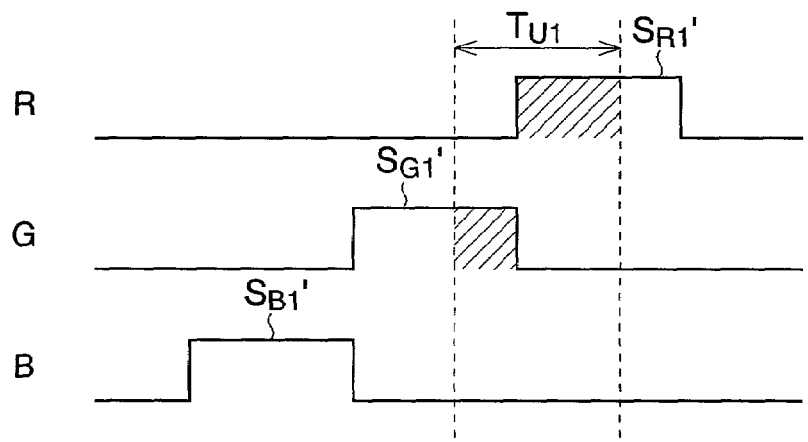
FIG. 15 shows the timing of reflected light beams to be received at the CCD when a measurement subject is disposed at a middle range.
Figure 16:
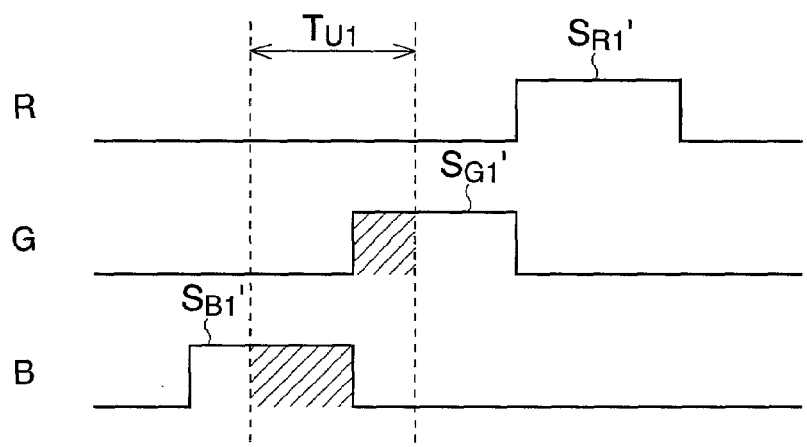
FIG. 16 shows the timing of reflected light beams to be received at the CCD when a measurement subject is disposed at a far end.

In the distance-information sensing operation of the present embodiment, the R, G, and B distance-measurement light beams $S_{B1}$, $S_{G1}$, and $S_{B1}$, which have the pulse width $T_S$, are successively and continuously radiated to a measurement subject for a period $3 \cdot T_S$, so that the distance of the measurement subject is calculated by detecting part of the reflected light in the accumulation period of which period $T_{U1}$ is approximately equivalent to the pulse width $T_S$. In the present embodiment, since the pulse width $T_S$ of the distance-measurement light beams $S_{B1}$, $S_{G1}$, and $S_{R1}$ and the period $T_{U1}$ of the accumulation period (such as the period $S_{A11}$ and $S_{A12}$) are approximately the same, there are three possible outcomes (as shown in FIGS. 14, 15, and 16) in which the distance-measurement light beams $S_{B1}$, $S_{G1}$, and $S_{R1}$ can be received by the photo-diodes 51 during the accumulation period. The distance between the measurement subject and the camera body determines which particular outcome.

FIG. 14 shows the case when a measurement subject is disposed at a short range, the range at which only the reflected pulse beam $S_{R1}'$ is received within the period $T_{U1}$. Namely, only the photo-diodes with the R color filter detect the reflected pulse beams $S_{R1}'$. In this case, the period $T_D$ of FIG. 9 is equivalent to $T_d$, so that the width $T_d$ of the hatched portion of the reflected pulse beam $S_{R1}'$, which is detected within the accumulation period, corresponds to the distance of the measurement subject.

FIG. 15 represents the case when a measurement subject is disposed at a middle range, the range which only the reflected pulse beam $S_{G1}'$ or only the reflected pulse beams $S_{G1}'$ and $S_{R1}'$ are received within the period $T_{U1}$. Namely, only the photo-diodes with R and G color filters detect the reflected pulse beams. The condition corresponds to the situation in FIG. 9, so that the to period $T_D$ is equivalent to the period $T_d+T_S$, as it is shown in FIG. 9.

FIG. 16 represents the case when a measurement subject is disposed at a far range, the range which only the reflected pulse beam $S_{B1}'$ or only the reflected pulse beams $S_{B1}'$ and $S_{G1}'$ are received within the period $T_{U1}$. Namely, only the photo-diodes with B and G color filters detect the reflected pulse beams. In this case, the period $T_D$ is equivalent to the period $T_d+2T_S$.

Namely, in the present embodiment, the R color measurement beam and the photo-diodes with R color filters are used for distance measurement of an object relatively disposed at a short range; the G color measurement beam and the photo-diodes with G color filters are used for distance measurement of an object relatively disposed at a middle range; the B color measurement beam and the photo-diodes with B color filters are used for distance measurement of an object relatively disposed at a far range. Note that distance from a pixel to the corresponding point of a subject is obtained from signal charges generated in the surrounding or adjacent R, G, and B photo-diodes. Note that the range in which a measurement subject exists for a certain pixel can be determined by checking whether a reflected measurement pulse has been detected in the pixel and the surrounding photo-diodes with the R, G, and B color filters attached.

In Step 122, the range, i.e., short, middle, or far, which a measurement subject corresponds to for each pixel is determined by investigating the existence of signal charges accumulated in each of photo-diodes with R, G, and B color filters attached. When the distance ranges for each of the pixels are determined, the distances for each of the pixels are calculated in accordance with the distance range. In the following description, the calculation method for the distance measurement will be exemplified for a measurement subject disposed at the middle range (i.e., the condition in FIG. 9 or FIG. 15). Note that, the effect of ambient daylight in determining the existence of signal charges accumulated in each of the photo-diodes may be compensated for by distance correction information which will be discussed in the following description.

It is supposed that the measurement subject of reflectance R is illuminated and an image of the measurement subject is formed on the CCD 28 while deeming that the measurement subject is a secondary light source. At this time, an output Sn, which is obtained by integrating electric charges generated in a photo-diode for an electric charge accumulation period t, is indicated as follows:

$$Sn = k \cdot R \cdot I \cdot t \quad (2)$$

wherein k is a proportional coefficient, which is varied in accordance with an F-number and a magnification of the photographing lens.

When the measurement subject is illuminated by light output from a light source, such as a laser, the luminance I is obtained by combining a luminance $I_S$, due to the light source, and a luminance $I_B$, due to the ambient light, which is indicated as follows:

$$I = I_S + I_B \quad (3)$$

As shown in FIG. 9, it is supposed that the electric charge accumulation period or the accumulation period $S_{A12}$ is $T_{U1}$, the pulse width of each distance-measurement light beam $S_{R1}$, $S_{G1}$, and $S_{B1}$ is $T_S$, a duration of the reflected light beam $S_{G1}'$ received in the accumulation period $S_{A12}$ is $T_d$, and the electric charge accumulation period is repeated N times for one field period. An output $SM_{10}$ obtained in a photo-diode with G color filter is described as follows:

$$SM_{10} = \Sigma(k \cdot R(I_S \cdot T_D + I_B \cdot T_{U1})) = k \cdot N \cdot R(I_S \cdot T_D + I_B \cdot T_{U1}) \quad (4)$$

Note that, the pulse width $T_d$ of the middle range has the following relationship with the pulse width of the distance-measurement light beam $T_S$, the propagation time of the distance-measurement light beam TD, and the measurement distance r.

$$T_d = T_D - T_S = \delta \cdot t - T_S = 2r/C - T_S \quad (5)$$

As shown in FIG. 12, when the period $T_{U2}$ of the accumulation period $S_{A3}$ is greater than the pulse width $T_S$ of the distance-measurement light beam $S_{G3}$ and the timing of the accumulation period $S_{A3}$ is controlled to receive the whole of the reflected light pulse beam, the output $SM_{20}$ from a photo-diode with a G color filter is:

$$SM_{20} = \Sigma(k \cdot R(I_S \cdot T_S + I_B \cdot T_{U2})) = k \cdot N \cdot R(I_S \cdot T_S + I_B \cdot T_{U2}) \quad (6)$$

As shown in FIG. 11, when the light sources 14R, 14G, and 14B are turned OFF (when carrying out electric charge accumulation for the accumulation period $S_{A2}$, the period having the same period $T_{U1}$ of FIG. 9) the output $SM_{11}$ from a photo-diode with G color filter is:

$$SM_{11} = \Sigma(k \cdot R \cdot I_B \cdot T_{U1}) = k \cdot N \cdot R \cdot I_B T_{U1} \quad (7)$$

Figure 13:
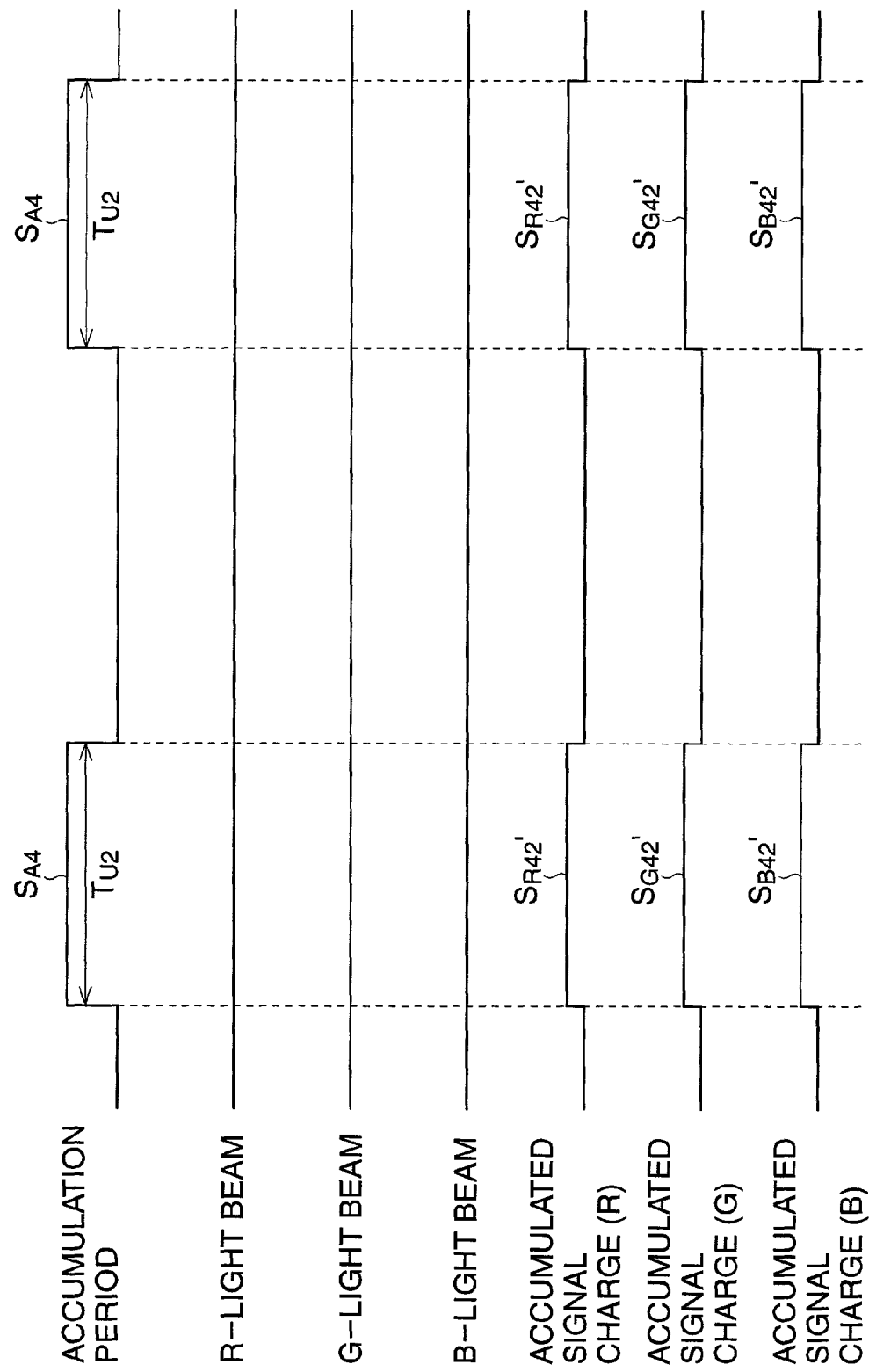
FIG. 13 is a timing chart of a reflectance correction information sensing operation.

Similarly, as shown in FIG. 13, when the light source 14R, 14G, and 14B are turned OFF (when carrying out electric charge accumulation for the accumulation period $S_{A4}$, the period having the same period $T_{U2}$ of FIG. 12) the output $S_{21}$ from a photo-diode with a G color filter, which corresponds to the hatched portion $S_{G32}'$, is:

$$SM_{21} = \Sigma(k \cdot R \cdot I_B \cdot T_{U2}) = k \cdot N \cdot R \cdot I_B \cdot T_{U2} \quad (8)$$

From the formulas (4), (6), (7) and (8), the following formula is obtained:

$$S_d = (SM_{10} - SM_{11})/(SM_{20} - SM_{21}) = T_d/T_S \quad (9)$$

As described above, the signal charges detected during the accumulation period $S_{A12}$ contain noise, such as ambient daylight (i.e., a luminance $I_B$ due to ambient daylight). $T_d/T_S$ included in formula (9) indicates the amount of the reflected light beam from the measurement subject (the beam which is received in the accumulation period $S_{A12}$ when the distance-measurement light beam $S_{G1}$ is radiated, and which is represented by the hatched portion S$G$11') is normalized by the entire amount of the distance-measurement light beam $SG_3$ which is received within the accumulation period, the amount which corresponds to the signal charge $S_{R3}'$. Namely, $T_d/T_S$ is equal to a ratio of the value of the light amount of the distance-measurement light beam $S_{A12}$ that is reflected by the subject and substantially received in the accumulation period $S_{A12}$ (represented by the hatched portion $S_{G11}'$) and from which the noise component that corresponds to the portion $S_{G12}'$ of FIG. 9 has been removed, to the value of the light amount corresponding to the whole of the distance-measurement light beam $S_{G3}$ (for which the signal charge corresponds to $S_{G3}'$) from which the noise component that corresponds to the electric charge $S_{G32}'$ of FIG. 13 has been removed.

$SM_{10}$, $SM_{11}$, $SM_{20}$ and $SM_{21}$ included in formula (9) are respectively stored as the distance information, the distance correction information, this reflectance information and the reflectance correction information, in Steps 106, 111, 116 and 121, respectively. Therefore, based on the information, the amount of Sd or $T_d/T_S$ is obtained. Since the pulse width $T_S$ is known, the distance r is obtained from formula (5) and $T_d/T_S$. Namely, the distance R is described as follows:

$$2r = C \cdot T_S \cdot ((SM_{10} - SM_{11})/(SM_{20} - SM_{21}) + 1) \quad (10)$$

Since formula (5) represents the situation where the measurement subject is at the middle range, formula (10) also indicates the relation at the middle range. When the measurement subject is at short range, formula (5) is reduced to the following:

$$Td = T_D = \delta \cdot t = 2r/C \quad (5a)$$

consequently, formula (10) is reduced to $$2r = C \cdot T_S \cdot (SM_{10} - SM_{11})/(SM_{20} - SM_{21}) \quad (10a)$$

Further, when the measurement subject is at the far range, formula (5) is reduced to $$Td = T_D - 2T_S = \delta \cdot t - 2T_S = 2r/C - 22T_S \quad (5b)$$

so that, the formula (10) is replaced with $$2r = C \cdot T_S \cdot ((SM_{10} - SM_{11})/(SM_{20} - SM_{21}) + 2) \quad (10b)$$

Note that, the determination of the distance range is carried out by determining the value $SM_{10} - SM_{11}$, in which the values $SM_{10}$ and $SM_{11}$ are obtained from the R, G, and B photo-diodes.

As described above, according to the present embodiment, the distance-measurement light beam is separated into the R, G, and B color components and R, G, and B distance-measurement light beams are sequentially and continuously emitted in a predetermined order, so that the photo-diodes with the R, G, and B color filters can be utilized for the distance measurement in the different ranges. As the result, the ranges for the distance measurement can be made large without requiring a long accumulation period. Further, the distance measurement may be completed in a short time, since there is no need to read signals from the CCD for each distance range. Furthermore, in the present embodiment, the R, G, and B color components are utilized for the distance measurement beams, so that the color filter array for a color still image may be applied for the distance measurement. Therefore, a single CCD can be used both for three-dimensional image capturing and the normal still color image capturing.

Note that, in the present embodiment, the G colored distance-measurement light beam is approximately simultaneously output when the pulse of the B colored distance-measurement light beam falls and then the R colored distance-measurement light beam is output approximately simultaneously with the fall of the G colored distance-measurement light beam. Although, the distance-measurement light beams are output succeedingly and continuously, and so as not to overlap each other, the distance-measurement light beams may be overlapped. Further, in the present embodiment, the pulse width or duration of the period $T_{U1}$ for the accumulation periods, $S_{A11}$, $S_{A12}$, $S_{A2}$, and so on, is set to the pulse width $T_S$ of the distance-measurement light beam, it may be set to a longer period.

Colors for the filters are not restricted to the Red, Green, and Blue color filters, so that a band transmission filter that has high transmittance in other wavelength regions may be used in accordance with a distance-measurement light beam that has the corresponding wavelength. For example, the invisible light region, such as the infrared band, may be used. Further, in the present embodiment, three colors are used for distance measurement, such as Red, Green, and Blue, however the number of the colors may be increased or decreased.

Note that, although in the present embodiment, the noise component of ambient daylight was given consideration and compensated for, whenever the effect of ambient daylight is negligible, $SM_{11}$ and $SM_{21}$ can be treated as zero.

Although the embodiments of the present invention have been described herein with reference to the accompanying drawings, obviously many modifications and changes may be made by those skilled in this art without departing from the scope of the invention.

The present disclosure relates to subject matter contained in Japanese Patent Application No. 2001-116674 (filed on Apr. 16, 2001) which is expressly incorporated herein, by reference, in its entirety.

What is claimed is:

1. A three-dimensional image-capturing device, comprising:
    a first light source that radiates a pulse-modulated first distance-measurement light beam of a first wavelength to a measurement subject;
    a second light source that radiates a pulse-modulated second distance-measurement light beam of a second wavelength to said measurement subject;
    a two-dimensional imaging device that comprises a first pixel which is able to sense light in a first band including said first wavelength and accumulates a corresponding amount of electric charge, and a second pixel which is able to sense light in a second band including said second wavelength and accumulates a corresponding amount of electric charge;

a first light-source control processor that drives said first and second light sources, so that an emission of said second distance-measurement light beam starts after a start and before an end of an emission of said first distance-measurement light beam;

a first imaging-device control processor that controls said two-dimensional imaging device to accumulate electric charges due to said first and second distance-measurement light beams in at least one of said first and second pixel within a predetermined first accumulation period; and a distance-information sensing processor that detects at least one reflected light beam of said first and second distance-measurement light beams reflected from said measurement subject within said first accumulation period, and calculates distance information of said measurement subject by using electric charges accumulated in a set of said first and second pixels, which are adjacently arranged.

2. A device according to claim 1, wherein said predetermined first accumulation period is longer than or equal to the pulse width of either of said first and second distance-measurement light beam.

3. A device according to claim 1, wherein said first accumulation period starts after an end of said emission of said second distance-measurement light beam.

4. A device according to claim 1, wherein said first band corresponds to one of red, green, and blue color bands and said second band corresponds to one of the other two remaining color bands.

5. A device according to claim 1, wherein said first wavelength corresponds to one of red, green, and blue color bands and said second wavelength corresponds to one of the other two remaining color bands.

6. A device according to claim 1, wherein light is selectively filtered by color filters so that said first and second bands are obtained.

7. A device according to claim 1, wherein pulse widths of said first and second distance-measurement light beams and said duration of said predetermined accumulation period are substantially the same.

8. A device according to claim 1, further comprising:
a second light-source control processor that drives said first and second light sources, so that said first and second distance-measurement light beams are emitted simultaneously;
a second imaging-device control processor that controls said two-dimensional imaging device to accumulate electric charges due to all of the reflected light beams of said first and second distance-measurement light beams in both of said first and second pixels within a predetermined second accumulation period; and
a reflectance-information sensing processor that detects both of said electric charges due to all of said reflected light beams of said first and second distance-measurement light beams within said second accumulation period as reflectance information, so that said distance information is normalized by said reflectance information.

9. A device according to claim 1, further comprising:
a third light source that radiates a pulse-modulated third distance-measurement light beam of a third wavelength to a measurement subject;

said two-dimensional imaging device comprises a third pixel which is able to sense light in a third band including said third wavelength and accumulates a corresponding amount of electric charge;

said first light-source control processor radiates said third distance-measurement light beam after the start and before the end of said emission of said second distance-measurement light beam;

said first imaging-device control processor carries out electric charge accumulation of said third pixel within said accumulation period;

said distance-information sensing processor detects at least one reflected light beam of said first, second, and third distance-measurement light beams reflected from said measurement subject within said accumulation period, and calculates distance information of said measurement subject by using electric charges accumulated in a set of said first, second, and third pixels which are adjacently arranged.

10. A device according to claim 9, wherein said predetermined accumulation period is longer than or equal to the pulse width of either said first, second, and third distance-measurement light beams.

11. A device according to claim 9, wherein said accumulation period starts after an end of said emission of said third distance-measurement light beam.

12. A device according to claim 9, wherein said first bands corresponds to one of red, green, and blue color bands, said second band corresponds to one of the other two remaining color bands, and said third band corresponds to the remaining color band.

13. A device according to claim 9, wherein said first wavelength corresponds to one of red, green, and blue color bands, said second wavelength corresponds to one of the other two remaining color bands, and said third wavelength corresponds to the remaining color band.

14. A device according to claim 9, further comprising:
a second light-source control processor that drives said first, second, and third light sources, so that said first, second, and third distance-measurement light beams are emitted simultaneously;
a second imaging-device control processor that controls said two-dimensional imaging device to accumulate electric charges due to all of the reflected light beams of said first, second, and third distance-measurement light beams in all of said first, second, and third pixels within a predetermined second accumulation period; and
a reflectance-information sensing processor that detects all of said electric charges due to all of said reflected light beams of said first, second, and third distance-measurement light beams within said second accumulation period as reflectance information, so that said distance information is normalized by said reflectance information.

15. A three-dimensional image-capturing device, comprising:
a first light source that radiates a pulse-modulated first distance-measurement light beam of a first wavelength to a measurement subject;
a second light source that radiates a pulse-modulated second distance-measurement light beam of a second wavelength to said measurement subject;
a two-dimensional imaging device that comprises a first pixel which is able to sense light in a first band including said first wavelength and accumulates a corresponding amount of electric charge, and a second pixel which is able to sense light in a second band including said second wavelength and accumulates a corresponding amount of electric charge;

a first light-source control processor that drives said first and second light sources, so that an end of an emission of said first distance-measurement light beam and a start of an emission of said second distance-measurement light beam are substantially simultaneous;

a first imaging-device control processor that controls said two-dimensional imaging device to accumulate electric charges due to said first and second distance-measurement light beams in at least one of said first and second pixel within a predetermined first accumulation period; and a distance-information sensing processor that detects at least one reflected light beam of said first and second distance-measurement light beams reflected from said measurement subject within said first accumulation period, and calculates distance information of said measurement subject by using electric charges accumulated in a set of said first and second pixels, which are adjacently arranged.

16. A three-dimensional image-capturing device, comprising:

a first light source that radiates a pulse-modulated first distance-measurement light beam of a first wavelength to a measurement subject;

a second light source that radiates a pulse-modulated second distance-measurement light beam of a second wavelength to said measurement subject;

a two-dimensional imaging device that comprises a first pixel which is able to sense light in a first band including said first wavelength and accumulates a corresponding amount of electric charge, and a second pixel which is able to sense light in a second band including said second wavelength and accumulates a corresponding amount of electric charge;

a first light-source control processor that drives said first and second light sources, so that an emission of said second distance-measurement light beam starts after a start, and before and substantially simultaneous with the end of an emission of said first distance-measurement light beam;

a first imaging-device control processor that controls said two-dimensional imaging device to accumulate electric charges due to said first and second distance-measurement light beams in at least one of said first and second pixel within a predetermined first accumulation period; and a distance-information sensing processor that detects at least one reflected light beam of said first and second distance-measurement light beams reflected from said measurement subject within said first accumulation period, and calculates distance information of said measurement subject by using electric charges accumulated in a set of said first and second pixels, which are adjacently arranged.

* * * * *